United States Patent
Chen et al.

(10) Patent No.: US 6,975,032 B2
(45) Date of Patent: Dec. 13, 2005

(54) COPPER RECESS PROCESS WITH APPLICATION TO SELECTIVE CAPPING AND ELECTROLESS PLATING

(75) Inventors: Shyng-Tsong Chen, Patterson, NY (US); Timothy J. Dalton, Ridgefield, CT (US); Kenneth M. Davis, Newburgh, NY (US); Chao-Kun Hu, Somers, NY (US); Fen F. Jamin, Wappingers Falls, NY (US); Steffen K. Kaldor, Fishkill, NY (US); Mahadevaiyer Krishnan, Hopewell Junction, NY (US); Kaushik Kumar, Beacon, NY (US); Michael F. Lofaro, Milton, NY (US); Sandra G. Malhotra, Beacon, NY (US); Chandrasekhar Narayan, Hopewell Junction, NY (US); David L. Rath, Stormville, NY (US); Judith M. Rubino, Ossining, NY (US); Katherine L. Saenger, Ossining, NY (US); Andrew H. Simon, Fishkill, NY (US); Sean P. E. Smith, Hopewell Junction, NY (US); Wei-tsu Tseng, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 303 days.

(21) Appl. No.: 10/319,967

(22) Filed: Dec. 16, 2002

(65) Prior Publication Data
US 2004/0113279 A1 Jun. 17, 2004

(51) Int. Cl.⁷ .............................................. H01L 23/48
(52) U.S. Cl. .......................................... 257/750; 257/751
(58) Field of Search ........................... 257/734, 758, 257/751, 750, 752; 438/759, 633

(56) References Cited

U.S. PATENT DOCUMENTS

| | | | |
|---|---|---|---|
| 5,262,354 A | 11/1993 | Cote et al. | |
| 5,604,156 A | 2/1997 | Chung et al. | |
| 5,675,185 A | 10/1997 | Chen et al. | |
| 5,793,112 A | 8/1998 | Hasegawa et al. | |
| 6,107,687 A | 8/2000 | Fukuda et al. | |
| 6,124,640 A | 9/2000 | Sahota et al. | |
| 6,184,138 B1 | 2/2001 | Ho et al. | |
| 6,251,786 B1 | 6/2001 | Zhou et al. | |
| 6,265,779 B1 | 7/2001 | Grill et al. | |
| 6,303,505 B1 | 10/2001 | Ngo et al. | |
| 6,323,554 B1 | 11/2001 | Joshi et al. | |
| 6,329,701 B1 | 12/2001 | Ngo et al. | |
| 6,331,481 B1 | 12/2001 | Stamper et al. | |
| 6,348,731 B1 | 2/2002 | Ashley et al. | |
| 6,368,953 B1 | 4/2002 | Petrarca et al. | |
| 6,380,084 B1 | 4/2002 | Lim et al. | |
| 6,395,607 B1 | 5/2002 | Chung | |
| 6,515,367 B1 * | 2/2003 | Bernard et al. | 257/758 |
| 6,521,523 B2 * | 2/2003 | Lee et al. | 438/633 |

FOREIGN PATENT DOCUMENTS

TW           494530          7/2002

OTHER PUBLICATIONS

T. Mori et al., "Metal Capped Cu Interconnection Technology by Chemical Mechanical Polishing", Jun. 18–20, 1996 VMIC Conference, pp. 487–492.

* cited by examiner

*Primary Examiner*—Roy Potter
(74) *Attorney, Agent, or Firm*—Gibb I.P. Law Firm, LLC; Lisa Jaklitsch, Esq.

(57) ABSTRACT

An integrated circuit structure is disclosed that has a layer of logical and functional devices and an interconnection layer above the layer of logical and functional devices. The interconnection layer has a substrate, conductive features within the substrate and caps positioned only above the conductive features.

19 Claims, 6 Drawing Sheets

COPPER RECESS PROCESS WITH APPLICATION TO SELECTIVE CAPPING AND ELECTROLESS PLATING

BACKGROUND OF THE INVENTION

1. Field of the Invention

The present invention generally relates to insulators/conductors above copper wiring connections on exterior interconnection layers of an integrated circuit structure, and more particularly to an improved process and structure for forming such interconnection layers.

2. Description of the Related Art

Integrated circuit processing can be generally divided into front end of line (FEOL) and back and of line (BEOL) processes. During FEOL processing, the various logical and functional devices are manufactured. The FEOL processing will generally form many layers of logical and functional devices. Layers of interconnections are formed above these logical and functional layers during the BEOL processing to complete the integrated circuit structure. Therefore, BEOL processing generally involves the formation of insulators and conductive wiring and contacts.

Recently, insulators (dielectrics) that have a lower dielectric constant (and are softer) are replacing older, harder, higher dielectric constant insulators. Lower dielectric constant materials generally have a dielectric constant below 3.0 and include polymeric low K dielectrics commercial products such as SiLK, available from Dow Chemical Company, NY, USA, FLARE, available from Honeywell, NJ, USA, microporous glasses such as Nanoglass (Porous SiO2), available from Honeywell, Inc., NJ, USA, as well as Black Diamond (Carbon-doped SiO2), available from Applied Material, CA, USA; Coral (Silicon carbide based dielectrics), available from Novellus Systems, Inc., CA, USA; and Xerogel, available from Allied Signal, NJ, USA. These lower dielectric constant insulators are referred to as "low-K" dielectrics. These low-K dielectrics are advantageous because they decrease overall capacitance, which increases device speed and allows lower voltages to be utilized (making the device smaller and less expensive).

Metals (such as copper, tungsten, etc.) are generally used as wiring and electrical connections in the BEOL interconnection layers. One drawback of using low-K dielectrics in the BEOL interconnection layers is that the low-K dielectrics are more sensitive to metal migration (e.g., copper migration) than were the higher-K dielectrics. One conventional solution to this problem is to use a blanket dielectric cap (having a high dielectric constant) as a metal diffusion barrier for low K dielectric material above the metal features. This blanket dielectric cap also acts as an oxygen barrier to prevent oxygen in the low k dielectric material from oxidizing the metal.

However, this dielectric cap usually has higher dielectric constant and will greatly affect the effective dielectric constant of the overall dielectric material between metal features. In addition, the dielectric cap generally needs to have a minimum thickness (e.g., 250 A) to be effective. However, if the dielectric cap is formed above a certain thickness, it will substantially distort the dielectric constant of the interconnect layer above a desired level. Therefore, there is a need for a new type of interconnection layer that does not require a blanket dielectric cap. The invention described below provides a method and structure for creating such an interconnection layer.

SUMMARY OF THE INVENTION

The invention provides an integrated circuit structure that has at least one layer of logical and functional devices and at least one interconnection layer above the layer of logical and functional devices. The interconnection layer has a substrate, conductive features within the substrate, and caps positioned only above the conductive features.

The invention can also have a barrier layer between the conductive features and the caps. The barrier layer can be a conductive material. The interconnection layer has an upper surface and the caps are positioned along the upper surface. The invention has a mask material along the upper surface and adjacent to the conductive features. The substrate has a lower dielectric constant than the mask which is below 3.0.

The invention also provides a method for selectively capping metal features of an interconnect structure. The interconnect structure is positioned above at least one layer of logical and functional devices. The invention recesses the metal features and then deposits a cap layer over the interconnect structure. The invention then planarizes the interconnect structure to form caps only above the metal features.

BRIEF DESCRIPTION OF THE DRAWINGS

The invention will be better understood from the following detailed description of preferred embodiments of the invention with reference to the drawings, in which.

DETAILED DESCRIPTION OF PREFERRED EMBODIMENTS OF THE INVENTION

As mentioned above, the conventional use of a high-K dielectric cap presents a number of disadvantages. The invention overcomes such disadvantages by forming the cap material only above metal areas such as wiring and inter-level interconnections. More specifically, as shown below, the invention polishes the interconnection layer down to a predetermined level, forms recesses in the tops of the metal portions, deposits the cap material over the entire interconnection layer, and then polishes the interconnection layer so that the cap material only remains within the recesses above the metal portions. Performing such processing, the invention substantially reduces the amount of high-K dielectric cap material within the structure, thereby avoiding the problems that are encountered when a blanket layer of dielectric cap material is utilized (discussed above).

Figure 1:
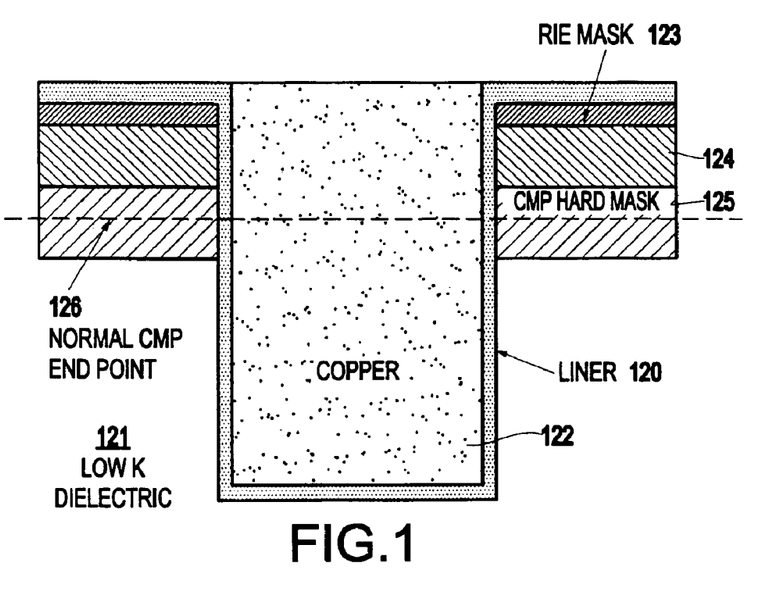
FIG. 1 is a schematic diagram of a partially completed integrated circuit structure according to the invention.

The processing used to achieve the inventive structure is shown in FIGS. 1–12, which represent multiple embodiments of the present invention. FIG. 1 begins with a partially completed BEOL interconnect structure that includes a conductive feature 122 formed in a low K dielectric 121. The conductive feature 122 can be any common conductor such as copper, tungsten, etc. and can serve the function of a wire, contact, stud, via, etc. depending upon the specific application and design and is referred to herein sometimes as a "metallic" or "copper" feature/conductor.

A liner 120 is in place around the metallic feature 122 to prevent the metallic feature 122 from diffusing into the low k dielectrics 121. FIG. 1 also illustrates a chemical mechanical polishing (CMP) hard mask 125 and a reactive ion etching (RIE) mask 123, 124. The methodologies and materials used to form the structure shown FIG. 1 are well-known and are not discussed herein for brevity, and so as to not obscure the salient features of the invention.

A chemical mechanical polishing process is applied to the structure shown in FIG. 1 to remove the uppermost portion of the metallic feature 122 and all of the RIE mask 123, 124. This polishing process comprises (or is followed by) a short non-abrasive slurry polish that removes metallic residue and allows the surface 130 to be substantially uniform. This processing reduces the height of the structure to the level shown as 130 in FIG. 2. This level 130 is above the normal CMP polishing end point 126 (shown as dashed line in FIGS. 1 and 2). Conventionally, the structure would be polished down to level 126 and then covered with a blanket high-K dielectric cap (which has the disadvantages that are discussed above).

Figure 3:
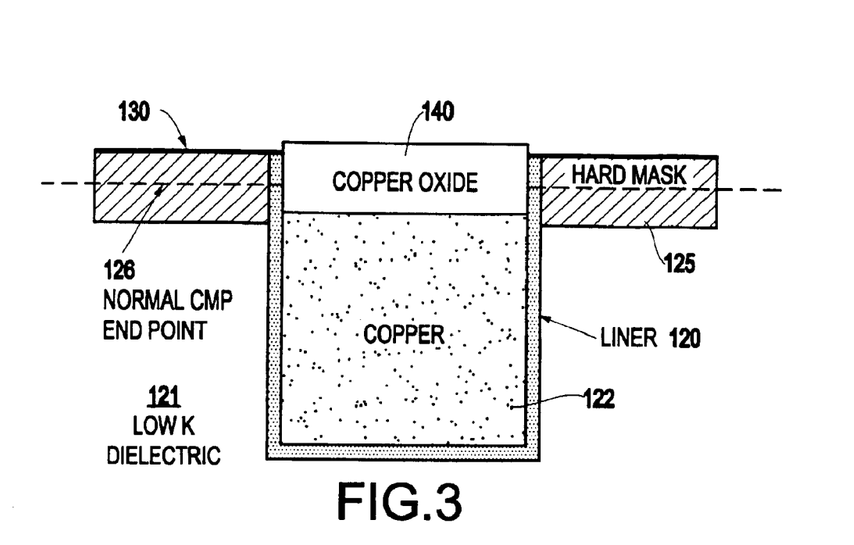
FIG. 3 is a schematic diagram of a partially completed integrated circuit structure according to the invention.
Figure 4:
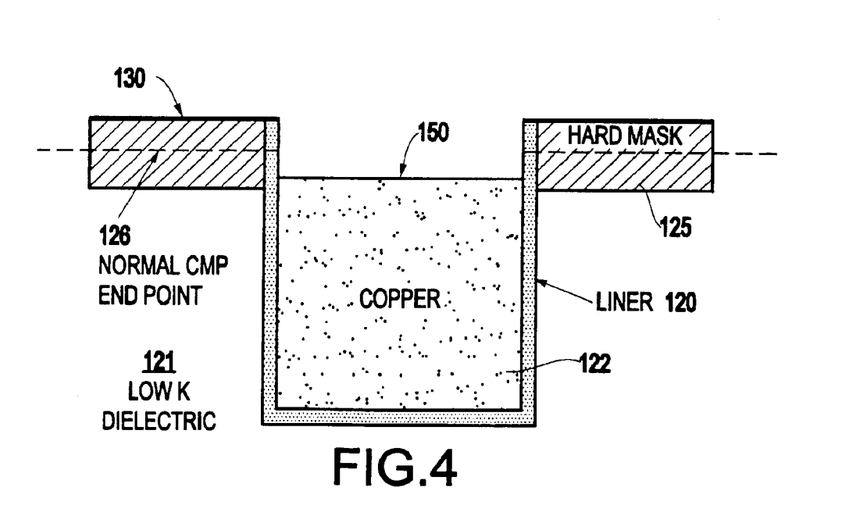
FIG. 4 is a schematic diagram of a partially completed integrated circuit structure according to the invention.

Rather than forming a blanket high-K dielectric cap as is done conventionally, the invention recesses the metallic structure 122 (using a number of different processes discussed below) and then fills in the recessed portion with cap material (which may be an insulator or conductor). One of the methods of recessing the metallic structures is shown in FIG. 3. In this process, the upper portion of the metallic feature 122 is oxidized to create an oxide portion 140 near the hard mask 125. This oxidized portion is then removed using a wet or dry chemistry (RIE) that attacks oxides (as shown in FIG. 4). This results in the structure shown in FIG. 4 that includes a recess 150 above the metallic feature 122. The depth of the recess is approximately equal to the height of the hard mask 125. For example, the hard mask could be approximately 500A thick and the recess could be approximately 500A. Depending upon the application and the desired overall dielectric constant, the recess can be made even deeper (e.g., >1000 A).

Figure 2:
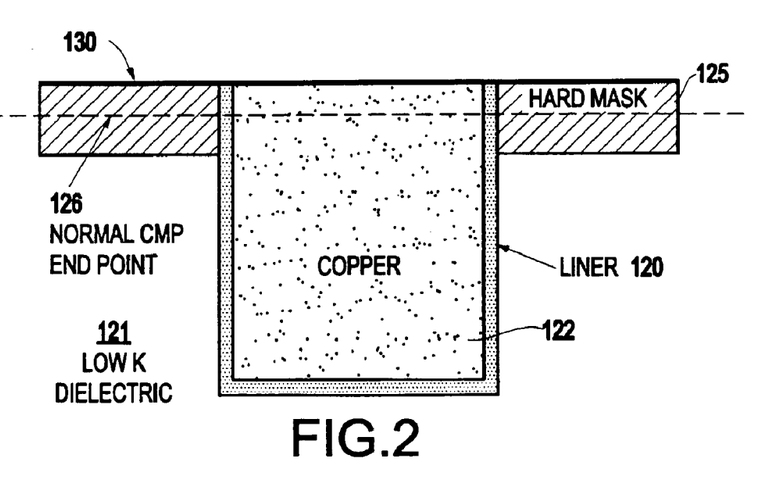
FIG. 2 is a schematic diagram of a partially completed integrated circuit structure according to the invention.

Alternatively, rather than creating the oxide 140, the structure shown in FIG. 2 can be subjected to an additional chemical etch or a dry etch that attacks the metallic feature 122 but does not substantially affect the hard mask 125 to create the recess 150 (thereby bypassing the processing shown in FIG. 3). For example, the non-abrasive slurry polishing discussed above could be continued for additional time period such that a similar amount of the conductor 122 is removed to create the recess 150 and create the structure shown in FIG. 4.

In any case, once the structure shown in FIG. 4 is created, in some embodiments of the invention, a barrier layer 160 is deposited over the structure and in the recess 150. In some other embodiments, the layer 160 is not formed and the processing proceeds directly from the structure shown in FIG. 4 to the structure shown in FIG. 7 (discussed in detail below) where the cap material 180 is deposited directly in the recess 150. The barrier layer 160 can be deposited on all surfaces (including vertical surfaces 165). Alternatively, the diffusion barrier 160 can be deposited only on the horizontal surfaces (avoiding vertical surfaces 165), again depending upon the specific application. It is preferable to have the barrier layer 160 deposited in a conformal process that avoids the formation of voids within the recess 150 (e.g., electroless plating, directional physical vapor deposition, etc.).

The chemical makeup of the barrier material 160 that will be utilized is different depending upon each specific design. For example, in one embodiment, the layer 160 comprises an electromigration inhibiting/diffusion barrier metal cap (e.g., CoWP, palladium, nickel, cobalt, antimony, chromium, molybdenum, platinum, ruthenium, rhodium, beryllium, hafnium, calcium, indium, cadmium, zinc, tin, tantalum and titanium) that prevents the conductor material 122 from diffusing into the cap material 180 (discussed below).

The barrier layer 160 allows the cap to be made even thinner (since the barrier layer prevents metal diffusion from the metallic feature 122 into the cap 180). By reducing migration between the cap 180 and the conductor 122, the barrier layer 160 enhances the electomigration lifetime (reduce migration of the conductor 122) which also reduces stress induced by such migration.

The electromigration lifetime and stress induced voiding are dependent on atomic transport at the interface between the conductor 122 and the barrier layer 160. The barrier layer 160 reduces such atomic transport, thereby providing maximum reliability. The conductor migration rate (drift velocity) is a product of mobility $(D/kT)*F$; where D is the effective diffusivity of the conductor, T is the absolute temperature in Calvin, k is the Boltzman constant, and F is the driving force from the applied electrical field or stress gradient.

The barrier 160 also improves adhesion between the conductor 122 and the metal (or dielectric) 180 and acts as a corrosion protection layer. The barrier layer 160 is conductive and would not be useful with conventional structures because it would cause shorting throughout the interconnect layer.

Figure 5:
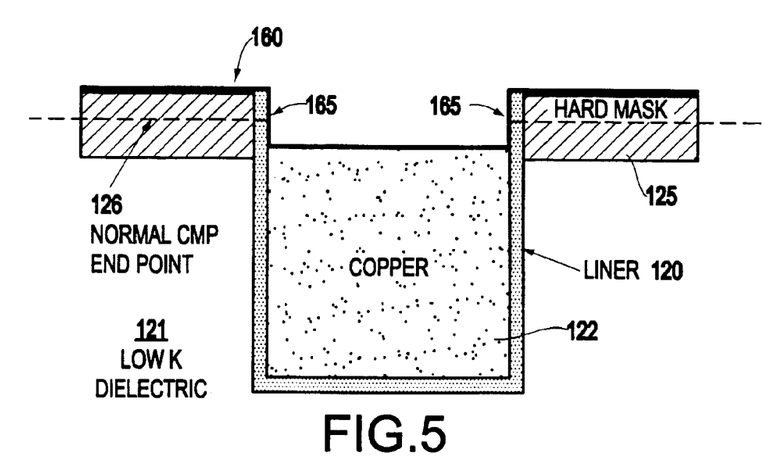
FIG. 5 is a schematic diagram of a partially completed integrated circuit structure according to the invention.
Figure 6:
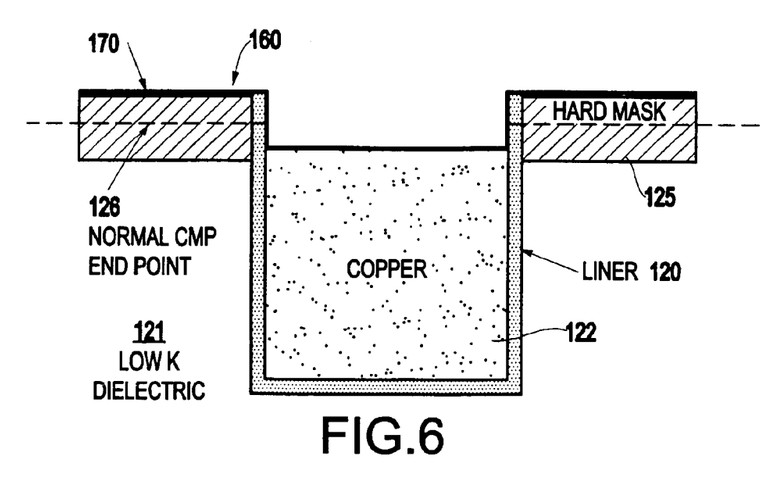
FIG. 6 is a schematic diagram of a partially completed integrated circuit structure according to the invention.
Figure 7:
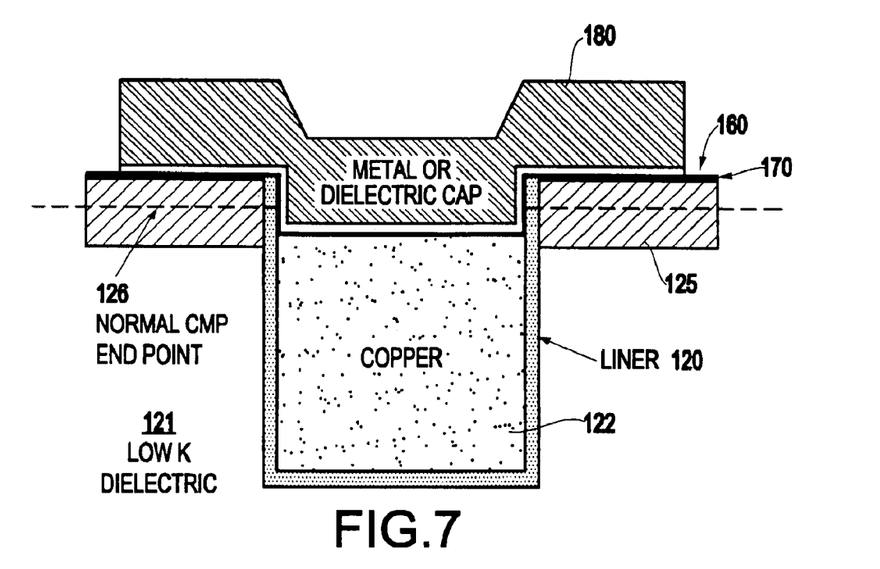
FIG. 7 is a schematic diagram of a partially completed integrated circuit structure according to the invention.

In one embodiment the barrier layer 160 is directly deposited within the recess and shown in FIG. 5. In another embodiment, before the barrier layer 160 is formed, a plasma vapor deposition (PVD) Pd seeding layer 170 is deposited as shown in FIG. 6. A pre-cleaning process (e.g., acidic pre-clean, forming gas anneal, hydrogen plasma treatment, etc.) may proceed the Pd seeding layer 170 deposition. The pre-cleaning and Pd seeding increases the uniformity of the CoWP layer 160. FIG. 7 illustrates the formation/deposition of the cap layer 180. As mentioned previously, the cap layer 180 can be formed directly in the recess 150 as shown in FIG. 5 or, various barrier layers 160, 170 can optionally be included before the cap layer 180 is deposited, as shown in FIG. 6. It is preferable to have the cap layer 180 deposited in a conformal process that avoids the formation of voids within the recess 150. It is also preferable to have the cap layer 180 deposited following the deposition of barrier layer 160, 170 without exposing the substrate to the air.

Figure 8:
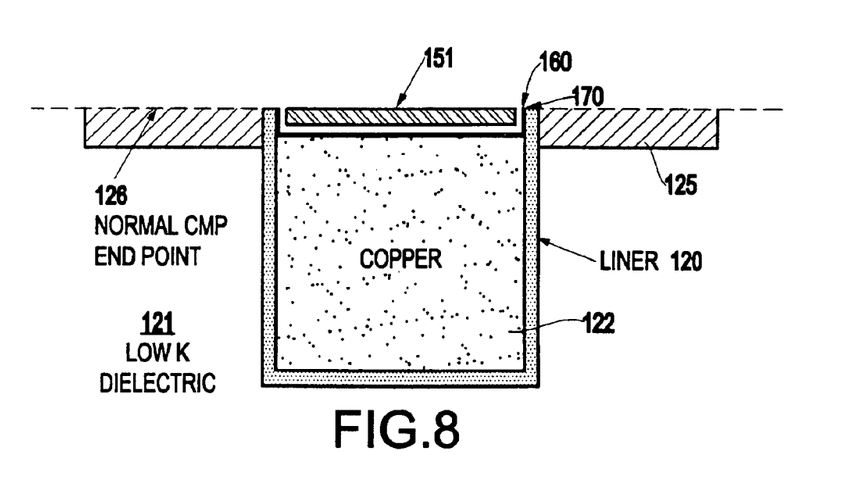
FIG. 8 is a schematic diagram of a partially completed integrated circuit structure according to the invention.
Figure 9:
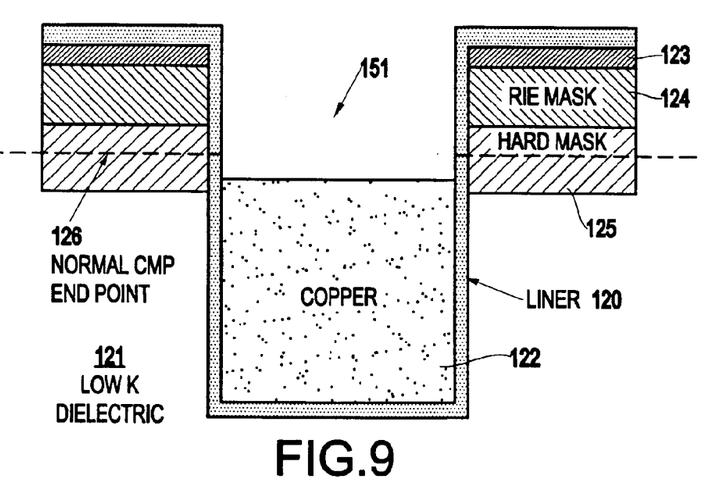
FIG. 9 is a schematic diagram of a partially completed integrated circuit structure according to the invention.

The cap layer can be a conductor or an insulator. The cap layer can comprise insulating materials including $SiO_2$, Boron-doped $SiO_2$, BPSG (Boron Phosphorous Silicate Glass), Silicon Carbide, Nitrogen doped silicon carbide, oxides, $Si_3N_4$, etc., and generally has a substantially higher dielectric constant than the low-K dielectric 121 or metallic materials such as TaN, TiN, TiSiN, Ta, W, etc. and generally has a good adhesion with low K dielectric material and also a good Copper and Oxygen barrier. As shown in FIG. 8, a chemical mechanical polishing process planarizes the structure down to level 126, thereby leaving caps 180 (and any optional layers 160, 170) only within the recess 150 above the conductor 122 and creating multiple caps along the upper surface of the interconnection layer. Therefore, with the inventive process, the cap material 180 does not comprise a blanket layer but, instead the cap material 180 comprising distinct and separate caps positioned only above the conductors 122 throughout the interconnect layer. As mentioned above, this substantially reduces the volume of cap material included within the BEOL interconnection layer.

FIGS. 9–12 illustrate yet another embodiment of the invention that forms the recess 151 while leaving the RIE mask 123, 124 intact. Therefore, this embodiment is different than the embodiment shown in FIG. 2 because the RIE mask 123, 124 shown in FIG. 1 is not removed before the recess 151 is formed (as shown and FIG. 9). The processes for forming the recess 151 are the same as those discussed above and are simply performed without the step shown in FIG. 2 of removing the RIE mask 123, 124.

Figure 10:
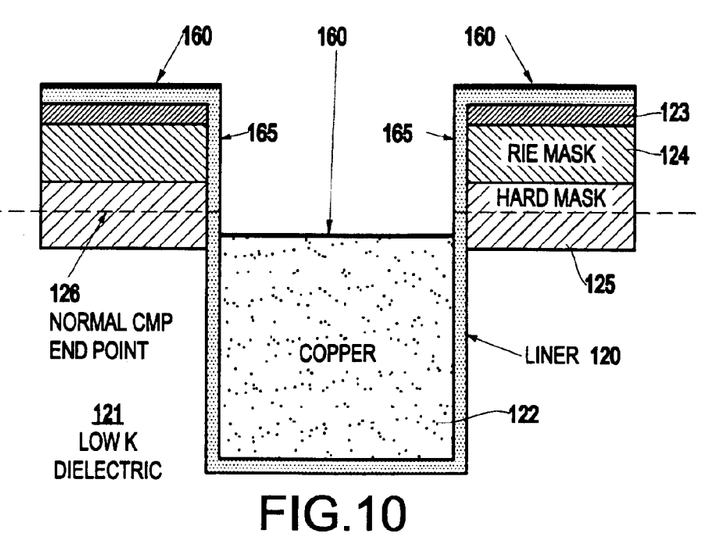
FIG. 10 is a schematic diagram of a partially completed integrated circuit structure according to the invention.
Figure 11:
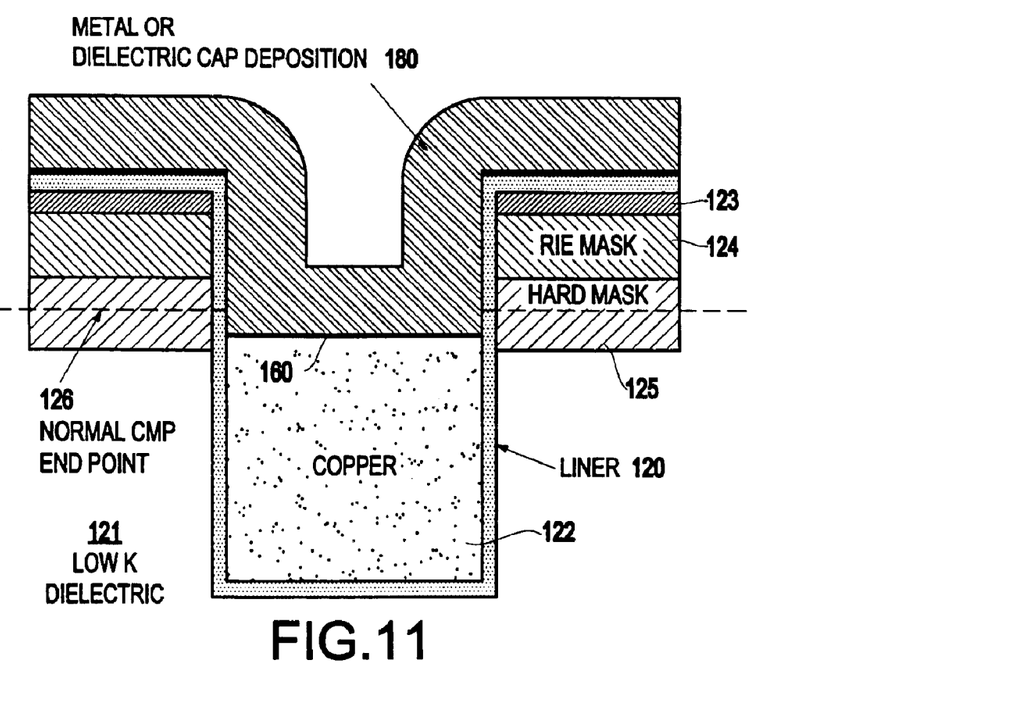
FIG. 11 is a schematic diagram of a partially completed integrated circuit structure according to the invention.
Figure 12:
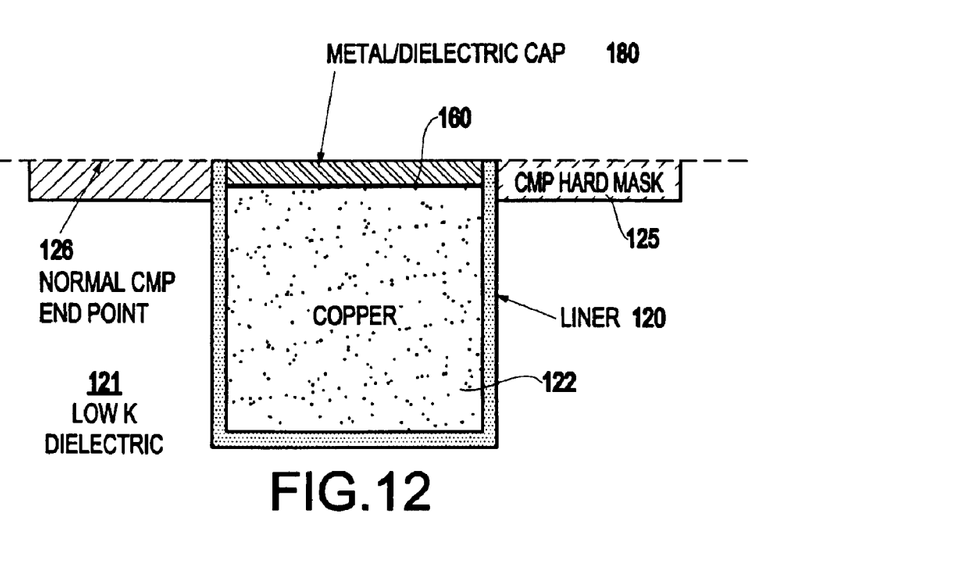
FIG. 12 is a schematic diagram of a partially completed integrated circuit structure according to the invention.

FIG. 10 illustrates the formation of the barrier layer 160. However, this embodiment illustrates that the barrier layer does not need to be formed on the sidewalls 165 of the recess 151. As with the previous embodiments, the barrier layer 160 can be formed on all surfaces or only on the horizontal surfaces. In addition, this embodiment does not utilize the optional Pd seeding layer 170 (however, it could). In FIG. 11, the cap material 180 is deposited (as discussed above) and in FIG. 12 the structure is planarized to result in a substantially similar structure to that shown in FIG. 8.

As shown above, the use of a blanket dielectric cap alters the dielectric constant of the BEOL interconnection layer undesirably, because the cap must be a certain thickness to be an effective barrier. However, this thickness usually does not scale as line width and thickness are reduced (from processing generation to processing generation). The invention uses a selective cap process (described above) to leave the cap material only on the metal features (and not between metal features). This process and structure greatly reduce the amount of higher-K dielectric cap material used in the BEOL interconnect layer.

In addition, some embodiments of the invention include a barrier layer 160 between the metallic feature 122 and the cap 180. By reducing surface diffusion of the conductor 122, the barrier layer 160 enhances the electromigration lifetime (reduce migration of the conductor 122) which also reduces stress induced by such migration. The barrier 160 also improves adhesion between the conductor 122 and the metal or dielectric cap 180 and acts as a corrosion protection layer. The barrier layer 160 is conductive and would not be useful with conventional blanket type structures because a blanket layer of a conductor would cause shorting throughout the interconnect layer. The inventive structure is also useful with imbedded etch stopping layers because the cap material does not disrupt the effectiveness of the etch stopping layer, as a conventional blanket dielectric cap would.

While the invention has been described in terms of preferred embodiments, those skilled in the art will recognize that the invention can be practiced with modification within the spirit and scope of the appended claims.

What is claimed is:

1. An integrated circuit structure comprising:
   at least one layer of logical and functional devices; and
   at least one interconnection layer above said layer of logical and functional devices,
   wherein said interconnection layer comprises:
   a substrate;
   conductive features within said substrate; and
   caps positioned only above said conductive features.

2. The structure in claim 1, further comprising a barrier layer between said conductive features and said caps.

3. The structure in claim 2, wherein said barrier layer comprises a conductive material.

4. The structure in claim 1, wherein said interconnection layer includes an upper surface and said caps are positioned along said upper surface.

5. An integrated circuit structure comprising:
   at least one layer of logical and functional devices; and
   at least one interconnection layer above said layer of logical and functional devices,
   wherein said interconnection layer comprises:
   a substrate;
   conductive features within said substrate;
   caps positioned only above said conductive features, wherein said interconnection layer includes an upper surface and said caps are positioned along said upper surface; and
   further comprising mask material along said upper surface and adjacent to said conductive features.

6. The structure in claim 5, wherein said substrate has a lower dielectric constant than said mask.

7. An integrated circuit structure comprising:
   at least one layer of logical and functional devices; and
   at least one interconnection layer above said layer of logical and functional devices,
   wherein said interconnection layer comprises:
   a substrate;
   conductive features within said substrate; and
   caps positioned only above said conductive feature,
   wherein said substrate has a dielectric constant below 3.0.

8. An interconnection layer structure for use in an integrated circuit structure above at least one layer of logical and functional devices, said interconnection layer comprising:
   a substrate;
   conductive features within said substrate; and
   caps positioned only above said conductive features.

9. The structure in claim 8, further comprising a barrier layer between said conductive features and said caps.

10. The structure in claim 9, wherein said barrier layer comprises a conductive material.

11. The structure in claim 8, wherein said interconnection layer includes an upper surface and said caps are positioned along said upper surface.

12. An interconnection layer structure for use in an integrated circuit structure above at least one layer of logical and functional devices, said interconnection layer comprising:
   a substrate;
   conductive features within said substrate;
   caps positioned only above said conductive features, wherein said interconnection layer includes an upper surface and said caps are positioned along said upper surface; and mask material along said upper surface and adjacent to said conductive features.

13. The structure in claim 12, wherein said substrate has a lower dielectric constant than said mask.

14. An interconnection layer structure for use in an integrated circuit structure above at least one layer of logical and functional devices, said interconnection layer comprising:
   a substrate;
   conductive features within said substrate; and
   caps positioned only above said conductive features; and
   wherein said substrate has a dielectric constant below 3.0.

15. An integrated circuit structure comprising:
   at least one layer of logical and functional devices; and
   at least one interconnection layer above said layer of logical and functional devices,
   wherein said interconnection layer comprises:
   a substrate;
   conductive features within said substrate;
   caps positioned only above said conductive features; and
   a conductive barrier layer between said conductive features and said caps.

16. The structure in claim 15, wherein said interconnection layer includes an upper surface and said caps are positioned along said upper surface.

17. An integrated circuit structure comprising:
   at least one layer of logical and functional devices; and
   at least one interconnection layer above said layer of logical and functional devices,
   wherein said interconnection layer comprises:
   a substrate;
   conductive features within said substrate;
   caps positioned only above said conductive features; and
   a conductive barrier layer between said conductive features and said caps, wherein said interconnection layer includes an upper surface and said caps are positioned along said upper surface; and
   mask material along said upper surface and adjacent to said conductive features.

18. The structure in claim 17, wherein said substrate has a lower dielectric constant than said mask.

19. An integrated circuit structure comprising:
   at least one layer of logical and functional devices; and
   at least one interconnection layer above said layer of logical and functional devices,
   wherein said interconnection layer comprises;
   a substrate;
   conductive features within said substrate;
   caps positioned only above said conductive features; and
   a conductive barrier layer between said conductive features and said caps,
   wherein said substrate has a dielectric constant below 3.0.

* * * * *